(12) United States Patent
Iwakiri et al.

(10) Patent No.: US 6,377,866 B2
(45) Date of Patent: *Apr. 23, 2002

(54) DEVICE FOR ENGRAVING AND INSPECTING A SEMICONDUCTOR WAFER IDENTIFICATION MARK

(75) Inventors: Yoshiichirou Iwakiri; Susumu Honda, both of Kanagawa (JP)

(73) Assignee: Shibaura Mechatronics Corporation, Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/984,993

(22) Filed: Dec. 4, 1997

(30) Foreign Application Priority Data

Dec. 6, 1996 (JP) .............................................. 8-326638

(51) Int. Cl.[7] ........................ H01L 21/301; H01L 21/46; H01L 21/78
(52) U.S. Cl. ........................ 700/121; 438/401; 438/460; 438/463; 438/700; 438/694
(58) Field of Search ................................ 438/401, 460, 438/462, 463, 700, 694

(56) References Cited

U.S. PATENT DOCUMENTS

| | | | | |
|---|---|---|---|---|
| 3,558,899 A | * | 1/1971 | Morgan | 250/566 |
| 3,562,536 A | * | 2/1971 | Brunner | 250/566 |
| 3,597,045 A | * | 8/1971 | Mathisen | 359/476 |
| 4,095,095 A | * | 6/1978 | Muraoka et al. | 235/375 |
| 4,166,574 A | * | 9/1979 | Yokoyama | 235/375 |
| 4,585,931 A | * | 4/1986 | Duncan et al. | 235/462.14 |
| 4,794,238 A | * | 12/1988 | Hampton | 235/462.32 |
| 4,954,842 A | * | 9/1990 | Hashimoto et al. | 346/139 R |
| 5,272,322 A | * | 12/1993 | Nishida et al. | 235/462 |
| 5,376,589 A | * | 12/1994 | Thienel | 437/226 |
| 5,434,403 A | * | 7/1995 | Amir et al. | 235/462.26 |
| 5,610,104 A | * | 5/1996 | Mitchell | 437/228 |
| 5,619,416 A | * | 4/1997 | Kosarew | 700/225 |
| 5,877,064 A | * | 7/1997 | Chang et al. | 438/401 |

\* cited by examiner

Primary Examiner—William Grant
Assistant Examiner—Edward F. Gain, Jr.
(74) Attorney, Agent, or Firm—Sughrue Mion, PLLC

(57) ABSTRACT

A device operable to apply an identification mark to a semiconductor wafer and inspect the applied mark immediately after its application. Engraving information and wafer thickness data are suppled to an engraving device and the engraving operation applies the mark to the wafer accordingly. A camera then reads the applied mark as read information and a comparator compares the read information to the engraving information and an error is determined in an information processing device. In order to maintain efficient operation of the mark application process, the error determined in the information processing device is then used to control the engraving device as it applies identification marks.

11 Claims, 2 Drawing Sheets

DEVICE FOR ENGRAVING AND INSPECTING A SEMICONDUCTOR WAFER IDENTIFICATION MARK

BACKGROUND OF THE INVENTION

1. Field of the Invention

The present invention relates to a method and a device for engraving a semiconductor wafer identification mark, which includes inspecting the engraving state of the identification mark engraved by a laser beam on the surface of a semiconductor wafer in the manufacturing process of the wafer, and controlling the engraving by the engraving device in accordance with the inspection.

2. Description of the Related Art

Conventionally, in the manufacturing process of a semiconductor wafer, a semiconductor wafer with an identification mark such as a character or a barcode engraved on the surface thereof by a laser beam is manufactured by the following process:

(1) cutting an ingot to obtain a sliced wafer;
(2) engraving an identification mark on the surface of the sliced wafer by use of an engraving device;
(3) lapping the sliced wafer;
(4) etching the lapped wafer;
(5) polishing and washing the etched wafer; and
(6) drying the washed wafer and reading only the barcode of the mark to inspect.

In this manufacturing process, inspection of nonconformities such as mispositioning of the engraved mark, stains or deflection of the characters is performed through each of the following processes:

(a) extracting one wafer immediately after the engraving of the identification mark by the engraving device, printing out the image by use of an identification mark-reading device, and inspecting the characters or the barcodes of the mark visually; and
(b) if the etching solution used in the etching reacts with the engraving scraps produced in the engraving, in order to confirm the stain, performing the barcode reading step for all the wafers immediately after the etching;
(c) after the final manufacturing process of the semiconductor wafer is completed, inspecting all the wafers by reading the barcode.

However, inspecting the image visually immediately after the engraving of the identification mark can only be performed at a frequency of 1 piece for 100 pieces of the manufactured semiconductor wafers in view of the manufacturing efficiency. It is difficult to inspect all the manufactured semiconductor wafers by this conventional method.

Moreover, even if defective marks are found in the barcode-reading inspection which is performed immediately after the etching or the final manufacturing process and if the defective marks are caused by the identification mark-engraving device, a large amount of defective items is produced. This results in a waste of time and money up through the finish of the etching process or the final manufacturing process.

Moreover, the barcode-reading inspection does not inspect the characters themselves, and thus even if the character of the identification mark of the semiconductor wafers not taken out in the image inspection is defective, the semiconductor wafer bearing the defective mark will be delivered to the market.

SUMMARY OF THE INVENTION

In view of the above problems, an object of the invention is to provide an engraving device for engraving an identification mark on a semiconductor wafer, which inspects all the engraved marks, as well as an engraving method using the engraving device, which can prevent the engraving of defective marks.

In accordance with the invention, the method for engraving an identification mark on a semiconductor wafer includes measuring the thickness of a sliced wafer, inputting the thickness information into an engraving device, inputting the engraving information of the mark to be engraved into the engraving device, deciding the shape of the mark and the engraving depth from the thickness information and the engraving information, engraving the mark on the sliced wafer, obtaining the read information of the engraved mark, comparing the read information with the engraving information, and controlling the engraving by the engraving device in accordance with the results.

Moreover, the device for engraving a semiconductor wafer identification mark includes a turntable supporting the bottom surface of a semiconductor wafer for rotating the semiconductor wafer in the horizontal direction, an engraving device body for inputting the engraving information of the engraved mark, a laser head disposed at the upper portion of the semiconductor wafer supported on the turntable and connected to the engraving device body, a reading body device for reading the engraved mark, a reading camera disposed at the upper portion of the semiconductor wafer supported on the turntable and connected to the reading device body, an information processing device for comparing the reading information of the mark with the engraved information. The engraving is controlled by the engraving device body in accordance with the comparison result.

The invention concerns to an engraving device which can simultaneously perform the engraving of the mark on the semiconductor wafer and the inspection of all the semiconductor wafers and control the device by comparing the results of the engraving and the inspection; as well as an engraving method which can prevent the recurrence of the defective mark in the control of the engraving device when a defective mark is engraved.

BRIEF DESCRIPTION OF THE DRAWINGS

The preferred embodiment of the invention is described with reference to the accompanying drawings wherein.

DETAILED DESCRIPTION OF THE PREFERRED EMBODIMENT

Figure 1:
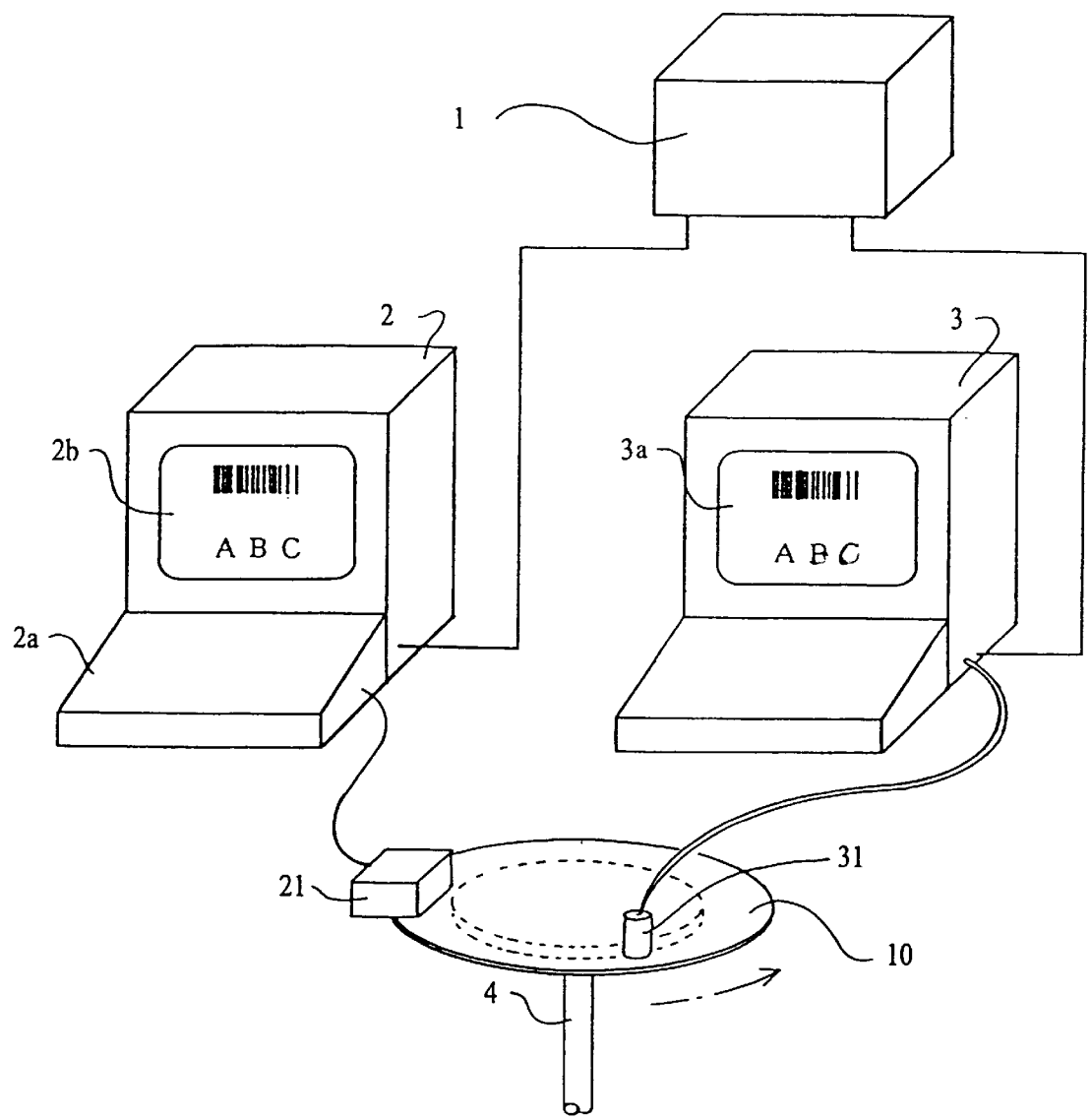
FIG. 1 is schematic diagram showing the engraving device of the invention.

Referring to FIG. 1, the engraving device includes a turntable 4 supporting the bottom surface of a sliced semiconductor wafer 10, which is rotated in the horizontal direction; an engraving device body 2, which is connected to a laser head 21 for engraving an identification mark on the sliced wafer 10; a reading device body 3, which is connected to a reading camera 31 for reading the engraved mark; and an information processing device 1 which is connected to the engraving device body 2 and the reading device body 3. In this embodiment, the engraving device body 2 and the reading device body 3 may be integrally constructed with the information processing device 1.

Engraving information for engraving the identification mark is inputted into the engraving device body 2 via a keyboard 2a, a computer mouse (not shown) or the like. The engraving information is confirmed on the screen 2b and sent to the information processing device 1. The laser head 21, which is connected to the engraving device body 2, is disposed over the engraved position of the sliced wafer 10. Moreover, the turntable 4 is rotated so that the reading camera 31 is disposed over the sliced wafer 10 and the identification mark is disposed thereunder. The identification mark read from the reading camera 31 is projected on the screen 3a of the reading device body 3 while the read information is sent to the information processing device 1.

The engraving is performed by the engraving device according to the following sequence:

(1) The engraving information such as the characters or barcode of the engraving identification mark is inputted into the engraving device body 2.

(2) The identification mark is engraved on the sliced wafter 10 supported by the turntable 4 by the laser head 21.

(3) The turntable 4 is rotated so that the identification mark is disposed under the reading camera 31.

(4) The identification mark is read out by the reading camera 31 and an image thereof is displayed on the reading device body 3.

(5) The engraving information inputted in the engraving device body and the identification mark read in the reading device body 3 are compared in the information processing device 1.

Figure 2:
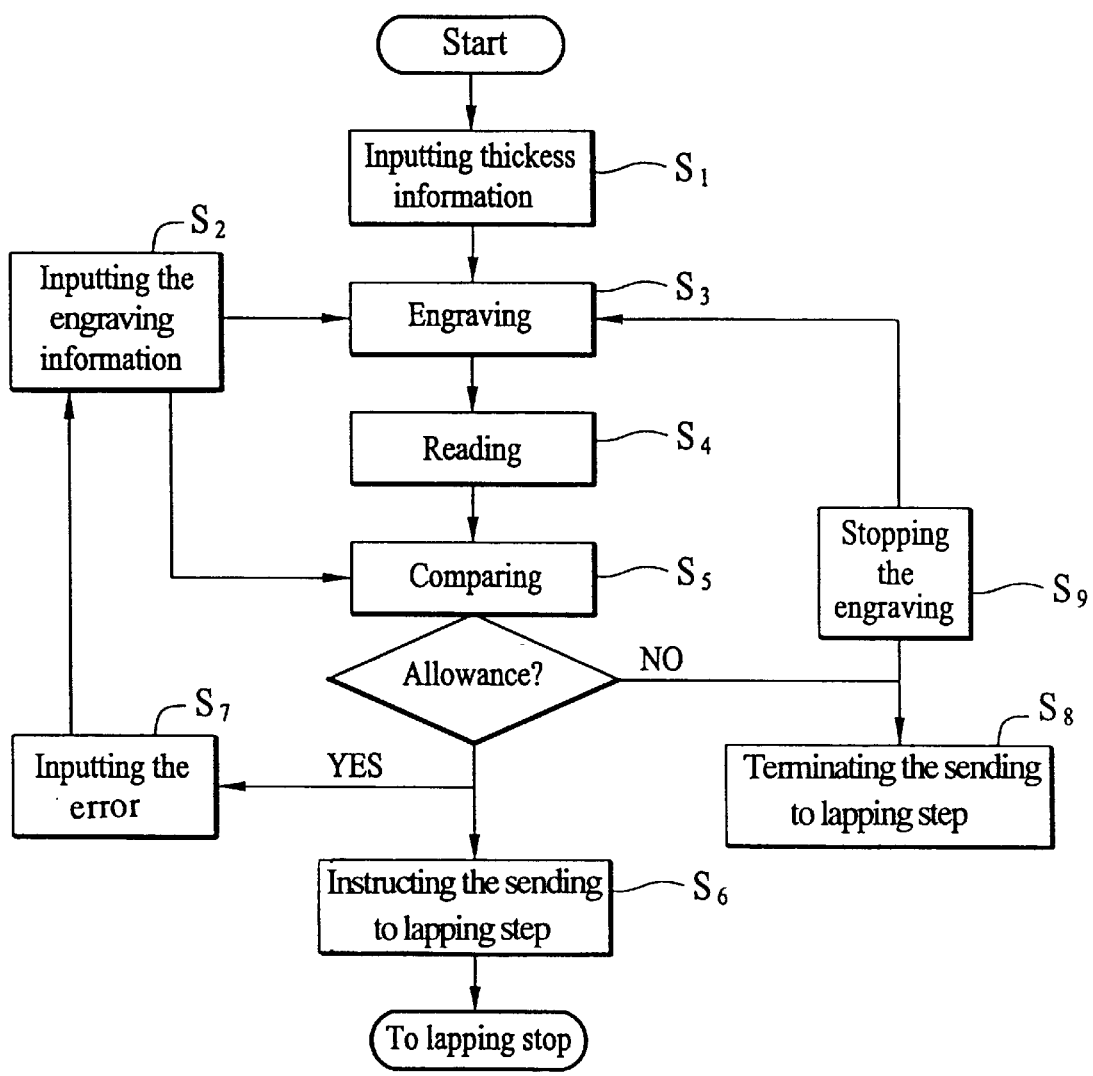
FIG. 2 is a flow chart showing the engraving process of the invention.

The engraving of the mark of this embodiment is performed by the following engraving process as shown in FIG. 2:

(1) measuring the thickness of the sliced wafer and inputting thickness information into the engraving device body ($S_1$).

(2) inputting the engraving information for engraving the identification mark into the engraving device body ($S_2$).

(3) deciding the shape and the engraving depth of the identification mark in accordance with the thickness information and the engraving information of the identification mark, and engraving the identification mark ($S_3$).

(4) reading the engraved mark by the reading device ($S_4$).

(5) comparing the read information and the engraving information by the information processing device ($S_5$).

(6) If the compared result is within the predetermined allowance, giving instructions for sending the engraved wafer to the lapping step ($S_6$), and calculating the error and inputting the error information for modifying the engraving to the engraving device body ($S_7$).

(7) If the compared result is not within the predetermined allowance, terminating the instructions for sending the engraved wafer to the lapping step ($S_8$) and stopping the engraving ($S_9$).

When the invention is constructed as above, all the engraved marks on the semiconductor wafers can be inspected, thus preventing the engraving of defective marks.

The foregoing description of the preferred embodiment of the invention has been presented for the purpose of illustration and description only. It is not intended to be exhaustive or to limit the invention to the precise form disclosed, and modifications and variations are possible in light of and within the scope of the invention. The preferred embodiment was chosen and described in order to explain the principles of the invention and its practical application to enable one skilled in the art to utilize the invention in various embodiment and with various modifications as are suited to the particular use contemplated. It is intended that the scope of the invention be defined by the claims appended hereto, and equivalents thereof.

What is claimed is:

1. A device for engraving an identification mark on a semiconductor wafer, comprising:

a table movably supporting a semiconductor wafer;

a laser head opposed to said table and engraving the identification mark on the semiconductor wafer supported on said table in accordance with engraving information;

an information output engraving device operable to automatically provide adjusted engraving information to the laser head, wherein said adjusted engraving information is based on error information;

a reading camera opposed to said table and reading the identification mark on the semiconductor wafer engraved by said laser head as read information; and an information processing device comparing the read information with the engraving information and deriving said error information as a result of said comparison, wherein the engraving operation of said laser head is automatically controlled in accordance with said adjusted engraving information and the engraving operation is automatically stopped if the error information exceeds a predetermined value.

2. A device according to claim 1, further comprising;

an engraving device body connected to said laser head and being inputted the engraving information for the identification mark, wherein the engraving information is forwarded from said engraving device body to said information processing device.

3. A device according to claim 1, wherein further comprising:

a reading device body connected to said reading camera and being inputted the read information from said reading camera, wherein the read information is forward from said reading device body to said information processing device.

4. A device according to claim 1, wherein said table is a turntable rotatable with a horizontal plane.

5. A device according to claim 4, wherein said laser head and said reading camera are disposed in the same orbit with respect to a center of said turntable.

6. A device as claimed in claim 1 wherein the engraving operation of each of a plurality of processed semiconductor wafers by said laser head is automatically and individually controlled in accordance with said adjusted engraving information.

7. A device for applying an identification mark to a semiconductor wafer, said device comprising:

a table movably supporting a semiconductor wafer;

a measuring device operable to measure the thickness of said wafer;

a laser head opposed to said table operable to apply the identification mark on the semiconductor wafer in accordance with engraving information and said measured thickness;

a reading camera opposed to said table operable to read the applied identification mark on the semiconductor wafer as read information; and an information processing device operable to compare the read information and the engraving information and determine an engraving error, wherein the operation of said laser head is controlled in accordance with said engraving error.

8. A device according to claim 7, further comprising;

an engraving device body connected to said laser head operable to receive the engraving information for the identification mark, wherein the engraving information is forwarded from said engraving device body to said information processing device.

9. A device according to claim 7, further comprising:

a reading device body connected to said reading camera operable to receive the read information from said reading camera, wherein the read information is forwarded from said reading device body to said information processing device.

10. A device according to claim 7, wherein said table is a turntable rotatable within a horizontal plane.

11. A device according to claim 10, wherein said laser head and said reading camera are disposed in the same orbit with respect to a center of said turntable.

* * * * *